(12) United States Patent
Song et al.

(10) Patent No.: US 9,900,239 B2
(45) Date of Patent: Feb. 20, 2018

(54) APPARATUS AND METHOD FOR TRANSMITTING AND RECEIVING MULTIMEDIA DATA IN MOBILE COMMUNICATION SYSTEM

(71) Applicants: Samsung Electronics Co., Ltd., Gyeonggi-do (KR); Postech Academy-Industry Foundation, Gyeongsangbuk-do (KR)

(72) Inventors: Hwang-June Song, Gyeongsangbuk-do (KR); Yoon-Min Ko, Gyeongsangbuk-do (KR); Oh-Chan Kwon, Gyeongsangbuk-do (KR); Hyeong-Nam Kim, Gyeongsangbuk-do (KR); Yong-Seok Park, Seoul (KR); Kang-Jin Yoon, Seoul (KR)

(73) Assignees: SAMSUNG ELECTRONICS CO., LTD., Suwon-si, Gyeonggi-Do (KR); Postech Academy-Industry Foundation, Gyeongsangbuk-do (KR)

( * ) Notice: Subject to any disclaimer, the term of this patent is extended or adjusted under 35 U.S.C. 154(b) by 194 days.

(21) Appl. No.: 14/518,980

(22) Filed: Oct. 20, 2014

(65) Prior Publication Data
US 2015/0109933 A1  Apr. 23, 2015

(30) Foreign Application Priority Data
Oct. 18, 2013 (KR) ........................ 10-2013-0125216

(51) Int. Cl.
*H04L 12/721* (2013.01)
*H04L 12/707* (2013.01)
(Continued)

(52) U.S. Cl.
CPC ...... *H04L 45/123* (2013.01); *H03M 13/3761* (2013.01); *H04L 1/0057* (2013.01); *H04L 45/124* (2013.01); *H04L 45/24* (2013.01)

(58) Field of Classification Search
CPC ............. H03M 13/3761; H03M 13/03; H03M 13/2906; H04L 1/0057
See application file for complete search history.

(56) References Cited

U.S. PATENT DOCUMENTS

2011/0219279 A1* 9/2011 Abu-Surra ........ H03M 13/2707
714/746
2012/0246538 A1  9/2012 Wu

FOREIGN PATENT DOCUMENTS

KR  10-2011-0138139  12/2011
KR  10-2012-0101942   9/2012
(Continued)

OTHER PUBLICATIONS

Yong Cui, et al., "FMTCP: A Fountain Code-based Multipath Transmission Control Protocol", IEEE 32nd International Conference on Distributed Computing Systems (ICSCS), Jun. 2012, 10 pages.

(Continued)

*Primary Examiner* — Marsha D. Banks Harold
*Assistant Examiner* — Elton Williams

(57) ABSTRACT

The present disclosure dynamically selects an optimal parameter so as to stably stream an image without user's setting in a network environment. The present disclosure determines (schedules) a path to which a general packet is to be distributed based on a path cost indicator, and determines a symbol size and the number of source symbols, which minimize or sufficiently reduce a cost function.

20 Claims, 9 Drawing Sheets

(51) Int. Cl.
 *H03M 13/37* (2006.01)
 *H04L 1/00* (2006.01)

(56) References Cited

FOREIGN PATENT DOCUMENTS

KR  10-1231265 B1  2/2013
WO  WO 2011/071472 A1  6/2011

OTHER PUBLICATIONS

Yonghak Hwang, et al., "Multipath Transport Protocol for Heterogeneous Multi-homing Networks", Proceedings of the ACM CoNEXT Student Workshop, Nov. 30, 2010, Philadelphia, PA, 2 pages.
Hyung Rai Oh, et al., "An Effective Mesh-pull-based P2P Video Streaming System Using Fountain Codes with Variable Symbol Sizes", Computer Networks, Aug. 2011, 14 pages.
Sangchun Han, et al., "An End-to-End Virtual Path Construction System for Stable Live Video Streaming Over Heterogeneous Wireless Networks", IEEE Journal on Selected Areas in Communications, vol. 29, No. 5, May 2011, 10 pages.

* cited by examiner

| Offset | 0 - 15 | 16 - 31 | |
|---|---|---|---|
| 0 | type [16] | symbol size [15] | ~ 350 |
| 32 | sequence [32] | | ~ 320 |
| 64 | subflow sequence [32] | | ~ 330 |
| 96 | block sequence [32] | | ~ 340 |
| 128 | estimated RTT | | |
| 160 | timestamp | | |
| 192 | number of source symbols [16] | ~ 310 | |
| | Payload [1024] | | |

FIG.3

| Offset | 0 - 15 | 16 - 31 | |
|---|---|---|---|
| 0 | type [16] | symbol size [15] | ~ 450 |
| 32 | subflow sequence [32] | | ~ 430 |
| 64 | block sequence [32] | | ~ 440 |
| 96 | estimated RTT | | |
| 128 | timestamp | | |
| 160 | symbol sequence [16] | number of source symbols [16] | ~ 410 |
| | Payload [1024] | | |

FIG.4

<LT codes>

<Raptor codes>

APPARATUS AND METHOD FOR TRANSMITTING AND RECEIVING MULTIMEDIA DATA IN MOBILE COMMUNICATION SYSTEM

CROSS-REFERENCE TO RELATED APPLICATION(S) AND CLAIM OF PRIORITY

The present application is related to and claims the priority under 35 U.S.C. § 119(a) to Korean Application Serial No. 10-2013-0125216, which was filed in the Korean Intellectual Property Office on Oct. 18, 2013, the entire content of which is hereby incorporated by reference.

TECHNICAL FIELD

The present disclosure relates to a method and apparatus for transmitting and receiving multimedia data in a communication system.

BACKGROUND

As various types of contents increase and high-capacity contents, such as High Definition (HD) contents, Ultra High Definition (UHD) contents, increase, data congestion becomes worse over a network. Due to the situation, the contents that a transmitter sends is not normally transferred to a receiver, and a part of the contents is lost on route. In general, data is transmitted based on a packet unit, and the data loss occurs based on a packet unit. Accordingly, the receiver fails to receive a packet due to the data loss on the network, and thus, may be unaware of the data in the lost packet. Therefore, it may cause deterioration of audio quality, degradation of video image quality or an image breaking, an omission of a subtitle, a loss of a file, and the like making an inconvenience for a user. Due to the above reasons, there is a desire for a method of restoring the data loss occurring on the network.

As one of the methods, raptor codes may be used, which is one of the channel coding methods, and has an advantage of freely adjusting a code rate which indicates a ratio of an amount of encoded data to existing information. The raptor code operates based on a block unit, and has the advantage of randomly selecting source symbols and generating a huge amount of encoded symbols. The raptor code may execute complete decoding without an error when a predetermined amount of encoded symbol is received, irrespective of the order of reception or a loss. A method of determining a code rate in consideration of a wireless network state, using the raptor code, a scheme of transmitting data encoded based on the determined code rate over a network, and the like have been provided.

However, the conventional technologies do not consider the selection of an effective parameter of a raptor code. The complexity of the raptor code is significantly changed based on a parameter, and may also be changed based on the performance of a device implementing the same. Also, the parameter may need to be changed dynamically based on a network state. When the parameter is inappropriately selected, effective network transmission may be impossible.

SUMMARY

To address the above-discussed deficiencies, it is a primary object to provide a method and apparatus for stably transmitting and receiving multimedia data using a raptor code in a mobile communication system that is based on a wireless multiple-path environment.

The present disclosure provides a method and apparatus for dynamically selecting an optimal parameter without user settings in a mobile communication system that is based on a wireless multiple-path environment.

In accordance with an aspect of the present disclosure, a method of transmitting multimedia data in a mobile communication system is provided. The method includes: setting a size of a source symbol and the number of source symbols to initial values; determining a packet distribution vector by a Path Cost Indicator (PCI); determining a code rate based on the packet distribution vector; calculating a penalty function based on the code rate; determining, for each block, a size of a source symbol and the number of source symbols, having the lowest penalty function value; and transmitting encoded multimedia data based on the size of the source symbol and the number of source symbols.

In accordance with another aspect of the present disclosure, a multimedia data transmitting apparatus in a mobile communication system is provided. The apparatus includes: a controller to set the size of a source symbol and the number of source symbols to initial values, to determine a packet distribution vector by a Path Cost Indicator (PCI), to determine a code rate based on the packet distribution vector, to calculate a penalty function based on the code rate, and to determine, for each block, the size of a source symbol and the number of the source symbols, having the lowest penalty function value; and a transmitting unit to transmit encoded multimedia data based on the size of the source symbol and the number of the source symbols.

In accordance with another aspect of the present disclosure, a method of receiving multimedia data in a mobile communication system is provided. The method includes: demodulating multimedia data transmitted from a transmitter; determining a size of a source symbol and the number of source symbols, for each block, from the decoded multimedia data; decoding the multimedia data based on the determined size of the source symbol and the determined number of source symbols, wherein determining of the size of the source symbol and the number of source symbols for each block comprises: determining a packet distribution vector by a Path Cost Indicator (PCI), determining a code rate based on the packet distribution vector, calculating a penalty function based on the code rate, and determining, for each block, a size of source symbol and the number of the source symbols, having the lowest penalty function value.

In accordance with another aspect of the present disclosure, a multimedia data receiving apparatus in a mobile communication system is provided. The apparatus includes: a demodulator to demodulate multimedia data transmitted from a transmitter; a controller to determine a size of a source symbol and the number of source symbols for each block, from the demodulated multimedia data; and a decoder to decode the multimedia data based on the determined size of the source symbol and the determined number of source symbols, wherein the controller determines a packet distribution vector by a Path Cost Indicator (PCI), determines a code rate based on the packet distribution vector, calculates a penalty function based on the code rate, and determines, for each block, a size of a source symbol and the number of the source symbols, having the lowest penalty function value, so as to determine the size of the source symbol and the number of the source symbols for each block.

The present disclosure may stably provide multimedia data using a raptor code, in a mobile communication system that is based on a wireless multiple-path environment.

The present disclosure may stably provide multimedia data by dynamically selecting an optimal parameter without user settings in a mobile communication system that is based on a wireless multiple-path environment.

The present disclosure may restore a packet loss caused by interference of a wireless channel, using a raptor code.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 3 illustrates a packet for transmitting general data (or raw data);

FIG. 4 illustrates a packet for transmitting redundant data;

DETAILED DESCRIPTION

Figure 1:
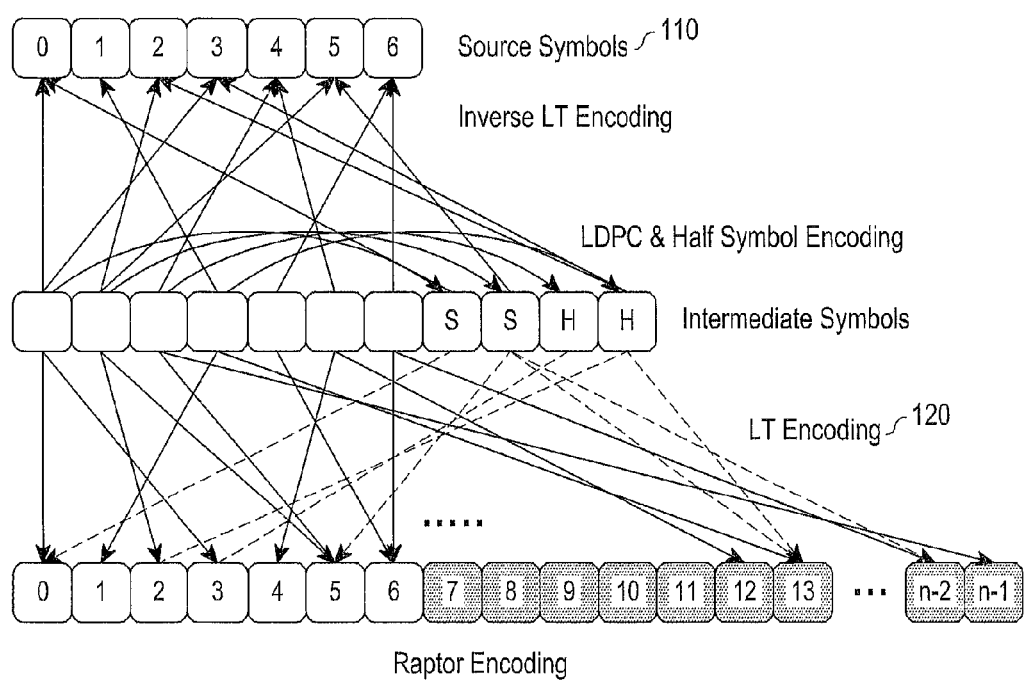
FIG. 1 illustrates a systematic raptor code.

FIGS. 1 through 10B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device. Hereinafter, exemplary embodiments of the present disclosure will be described in detail with reference to the accompanying drawings. The same elements will be designated by the same reference numerals although they are shown in different drawings. Further, detailed descriptions related to well-known functions or configurations capable of making subject matters of the present disclosure unnecessarily obscure will be omitted.

The terms and words used in this specification and claims should not be construed as limited to the common or lexical definitions, and should be interpreted as definitions and conceptions corresponding to the spirit and scope of the present disclosure based on the principle that inventors may pertinently define conceptions of the terms in order to describe their own disclosures in the best way. An embodiment of the present disclosure provides a stable multimedia data providing method using a raptor code in a wireless multiple-path environment. In this instance, for the effective use of a raptor code, the complexity of a raptor code is determined based on a performance of a device that executes encoding, and an optimal raptor code parameter, which smoothly provides multimedia data is determined based on a multiple-network state. Through the above, the present disclosure may dynamically select an optimal parameter so as to stably provide multimedia, without user settings, in various devices and rapidly varying network circumstances.

An embodiment of the present disclosure uses systematic raptor codes, as shown in FIG. 1. In a case of the systematic raptor code, a source symbol 110 (symbols 0 through 6) is included in an encoded symbol as is, and a redundant symbol (symbols from symbol 7, also referred to as a parity bit) may be generated based on a code rate. The raptor encoding generates an intermediate code, executes Luby Transform (LT) encoding 120 on the intermediate code, and completes the process. In raptor encoding according to an embodiment of the present disclosure, a size of each symbol and the number of source symbols included in a block are used as importable parameters.

Figure 2:
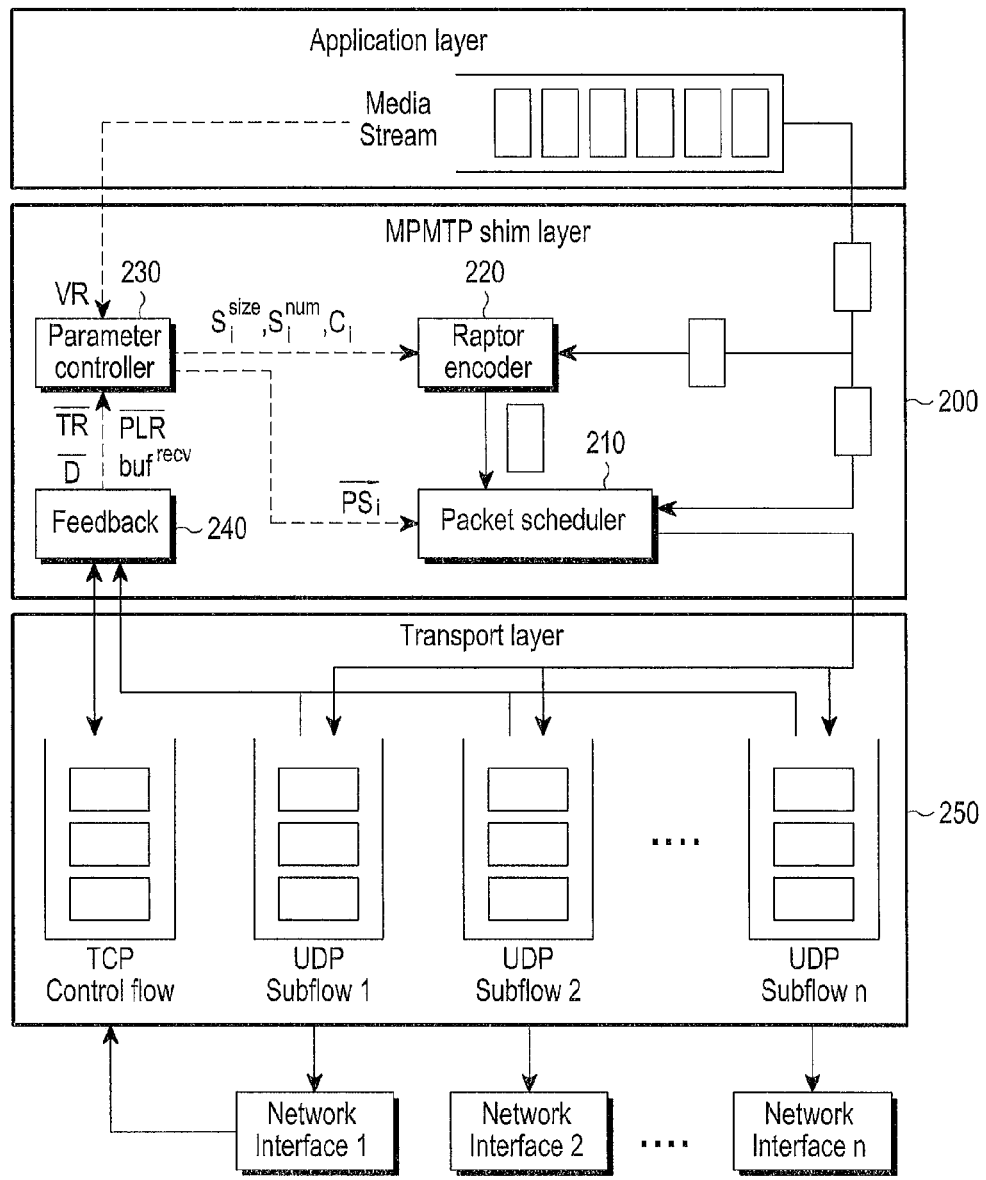
FIG. 2 illustrates a whole system according to an embodiment of the present disclosure.

A system structure according to an embodiment of the present disclosure is as shown in FIG. 2.

The diagram 200 is not limited to a Multipath Multimedia Transport Protocol (MPMTP) shim layer, and may be applied to a layer of a communication system of a multiple-path environment. The system according to an embodiment of the present disclosure uses a Transfer Control Protocol (TCP) for transferring an importable control message, and may use a User Datagram Protocol (UDP) for actual data transmission. UDP ports may be generated as many as the number of multiple paths that are used, and used for transmitting data. As illustrated in FIG. 2, UDP subflows (UDP subflows 1, . . . , and n of FIG. 2), as many as the number of multiple paths, are included in a transport layer 250. In addition, the system of FIG. 2 supports various network interfaces (Network Interface 1, . . . , and n of FIG. 2), such as 3rd Generation (3G), Long Term Evolution (LTE), in addition to WiFi. When image data is transmitted from an application layer, each packet of the corresponding data may be transmitted to one of the multiple paths through a packet distributor 210 (corresponding to a packet scheduler of FIG. 2, and hereinafter, the packet distributor and the packet scheduler being used interchangeably with one another). In parallel, a raptor encoding module 220 (corresponding to a raptor encoder of FIG. 2) stores transmitted data in a buffer, and executes raptor encoding based on a block unit. In the same manner, a redundant symbol generated after encoding is transmitted through multiple paths through the packet distributor 210. In this instance, a parameter control module 230 (corresponding to a parameter controller of FIG. 2) determines an optimal parameter by receiving a feedback associated with a network state (bandwidth, delay, packet loss rate, and the like) and a buffer state of a receiving end. A parameter according to an embodiment of the present disclosure includes the size of each symbol ($s_i^{size}$), and the number of source symbols ($s_i^{num}$) included in a block. Hereinafter, and $s_i^{size}$ and s are interchangeably used to indicate the size of each symbol, and $s_i^{num}$ and k are interchangeably used to indicate the number of source symbols included in a block.

In the MPMTP, TCP-friendly rate control (TFRC) is used for controlling a transmission rate of a UDP subflow. The TFRC is an algorithm that provides a transmission rate for a real-time network application.

The transmission rate $tr^{TFRC}$ determined by the TFRC may be expressed by the following Equation 1.

$$tr^{TFRC} = \frac{P^{size}}{r \cdot \sqrt{\frac{2 \cdot p}{3}} + 12 \cdot p \cdot \sqrt{\frac{3 \cdot p}{8}} \cdot (1 + 32 \cdot p^2)} \qquad \text{[Equation 1]}$$

Here, r denotes a Round Trip Time (RTT), $P^{size}$ denotes a size of a packet, and p denotes a Packet Loss Rate (PLR) between 0 and 1. However, the TFRC may not be applied to a wireless network environment.

The PLR p in Equation 1 calculates only the packets that are lost due to the network congestion. However, the packet loss caused by wireless channel errors may unfairly limit a transmission rate through wireless networks. Therefore, the MPMTP uses a loss difference algorithm called Spike to distinguish the congestion and the wireless loss. Spike distinguishes a type of loss using a Relative One-way Trip Time (ROTT) in a receiver. The ROTT indicates a packet transmission time that is taken for transmitting a packet from a transmitter to a receiver. According to Spike, when a measured ROTT is greater than $B^{spikestart}$, it is estimated that the loss is caused by congestion. Conversely, when the measured ROTT is less than $B^{spikeend}$, it is estimated that the loss is caused by a wireless channel error. In Spike, $B^{spikestart}$ and $B^{spikeend}$ are defined as shown in Equation 2.

$$B^{spikestart} = rott^{min} + \alpha \cdot (rott^{max} - rott^{min}),$$

$$B^{spikeend} = rott^{min} + \beta \cdot (rott^{max} - rott^{min}), \qquad \text{[Equation 2]}$$

In Equation 2, α and β are constant values between 0 and 1, and $rott^{min}$ and $rott^{max}$ indicate the lowest ROTT and the highest ROTT, observed so far. In the MPMTP, a receiver feeds two types of PLR back to a transmitter using Spike. The PLR is generated by a network congestion $plr^c$ and a network channel error $plr^W$. The transmitter controls the TFRC based on $plr^c$, and determines a code rate of a raptor code using $plr^W$.

FIG. 3 illustrates a packet for transmitting general data (or raw data), and FIG. 4 is a diagram illustrating a packet for transmitting redundant data. The packet of FIGS. 3 and 4 corresponds to the diagram of an MPMTP shim layer packet of FIG. 2.

The packet of FIGS. 3 and 4 includes information associated with a symbol size 350 and 450 and the number of symbols (source symbols) (k or $s_i^{num}$) 310 and 410 since the number of symbols is changed for each block.

The packet of FIGS. 3 and 4 includes a sequence 320 for reordering packets transmitted through multiple paths, and a subflow sequence 330 and 430 for determining a loss rate of a packet transmitted through each path. In addition, the packet of FIGS. 3 and 4 includes a block sequence 340 and 440 for determining that general data and redundant data correspond to an identical block.

Figure 5:
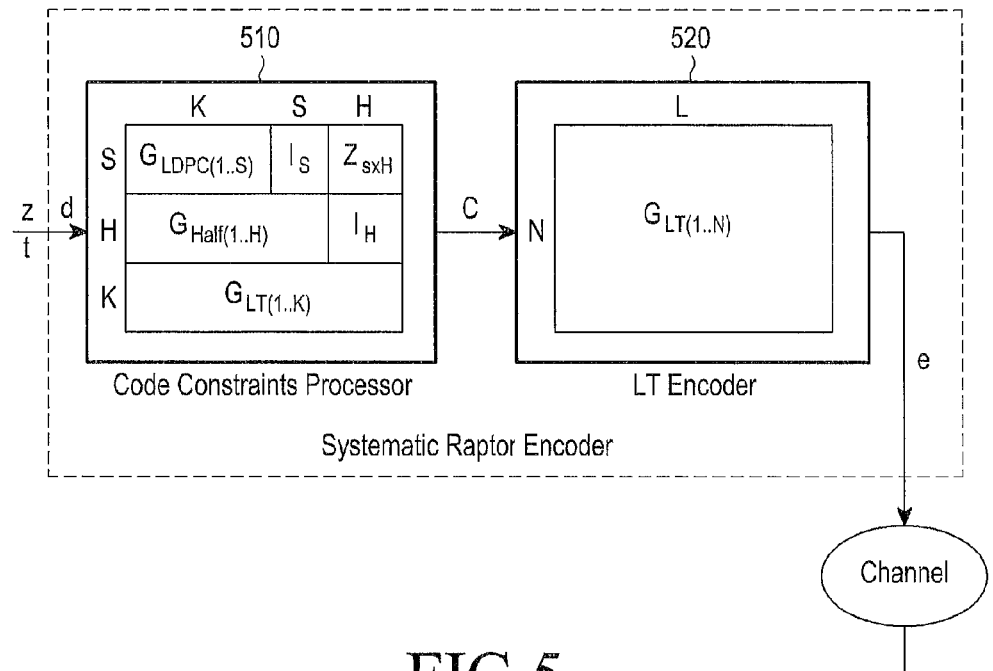
FIG. 5 illustrates a raptor encoder according to an embodiment of the present disclosure.

FIG. 5 illustrates a raptor encoder according to an embodiment of the present disclosure.

Although a few of encoded symbols are lost during a transmission process through a network when the generated encoded symbols are transmitted to a receiving side, the raptor code may restore an original source symbol when at least a predetermined amount of encoded symbol is received. The number of encoded symbols (k') that is required or used to successfully restore k source symbols in a source block is defined by Equation 3.

$$k' = (1+\delta) \cdot k \qquad \text{[Equation 3]}$$

In Equation 3, δ denotes a symbol overhead, and is a real number, which generally has a small value. The above equation indicates that all of the source symbols are smoothly restored through encoded symbols of which the number is slightly greater than the number of the source symbols. The code rate (c) is defined by the following Equation 4.

$$c = k/n \qquad \text{[Equation 4]}$$

In Equation 4, k denotes the number of source symbols, and n denotes the number of encoded symbols.

As illustrated in FIG. 5, raptor encoding generates an intermediate code through a Code Constraints Processor (CCP) 510, executes Luby Transform (LT) encoding 520 on the intermediate code, and completes the process. The raptor encoding time is divided into a time for generating a matrix for encoding in association with FIG. 1, and a time for executing XOR on a symbol based on the generated matrix. In the present disclosure, for example, a CCP/LT matrix is previously generated for the number of predetermined source symbols and, thus, the time for generating the matrix for encoding may be excluded when the raptor encoding time is calculated. Therefore, the raptor encoding time may be linearly modeled based on an amount of symbols on which the XOR is executed. Here, the CCP/LT matrix may be extracted using a memory, may be given in a transmitting apparatus, or may be generated in the transmitting apparatus.

When the number of source symbols is k, and the code rate is c, the number of times of XOR of the CCP matrix $G^{CCP^{enc}}$ for encoding and the LT matrix $G^{LT^{enc}}$ for encoding, are as shown in Equation 5 and Equation 6.

$$XOR^{CCP^{enc}}(k) = \sum_{i=1}^{L(k)} \sum_{j=1}^{L(k)} g_{ij}^{CCP^{enc}} \qquad \text{[Equation 5]}$$

$$XOR^{LT^{enc}}(k,c) = \sum_{i=1}^{N(k,c)} \sum_{j=1}^{L(k)} g_{ij}^{LT^{enc}} \qquad \text{[Equation 6]}$$

When a size of a symbol is s based on Equation 5 and Equation 6, the raptor encoding time may be calculated as shown in Equation 7 and Equation 8.

$$enc^{time}(s,k,c) = \gamma_{coef}^{enc}(s) \cdot XOR_{byte}^{enc}(s,k,c) \qquad \text{[Equation 7]}$$

$$XOR_{byte}^{enc}(s,k,c) = s \cdot (XOR^{CCP^{enc}}(k) + XOR^{LT^{enc}}(k,c)) \qquad \text{[Equation 8]}$$

In Equation 8, $XOR_{byte}^{enc}(s,k,c)$ denotes an amount of byte on which XOR is executed for raptor encoding, and in Equation 7, $\gamma_{coef}^{enc}(s)$ is an XOR operation coefficient for encoding and is different based on the hardware performance of a device that executes raptor encoding.

A system according to an embodiment of the present disclosure calculates an XOR operation coefficient before communication begins.

When the number of source symbols is s and the code rate is c, the number of times of XOR of the CCP matrix ($G^{CCP^{dec}} \in \{0,1\}^{L'(k) \times L(k)}$) for decoding and the LP matrix ($G^{LT^{dec}} \in \{0,1\}^{L'(k) \times L(k)}$) for decoding, are as follows.

$$XOR^{CCP^{dec}}(k) = \sum_{i=1}^{L'(k)} \sum_{j=1}^{L(k)} g_{ij}^{CCP^{dec}} \quad \text{[Equation 9]}$$

$$XOR^{LT^{dec}}(k) = \sum_{i=1}^{k} \sum_{j=1}^{L(k)} g_{ij}^{LT^{dec}} \quad \text{[Equation 10]}$$

$g_{ij}^{CCP^{dec}}$ denotes an element of $G^{CCP^{dec}}$ in an $i^{th}$ row and a $j^{th}$ column, and $g_{ij}^{LT^{dec}}$ denotes an element of $G^{LT^{dec}}$ in an $i^{th}$ row and a $j^{th}$ column. However, the CCP decoding matrix $G^{CCP^{dec}}$ may not be processed in a transmitter. Therefore, an approximated number of times of XOR may be used for a CCP decoding matrix $\widetilde{XOR}^{CCP^{dec}}(k)$ which may be experimentally obtained.

When a size of a symbol is s based on Equation 9 and Equation 10, the raptor encoding time may be calculated as shown in Equation 11 and Equation 12.

$$\widetilde{XOR}_{byte}^{dec}(s,k) = s \cdot (\widetilde{XOR}^{CCP^{dec}}(k) + XOR^{LT^{dec}}(k)) \quad \text{[Equation 11]}$$

$$\widetilde{dec}^{time}(s,k) = \gamma_{coef}^{dec}(s) \cdot \widetilde{XOR}_{byte}^{dec}(s,k) \quad \text{[Equation 12]}$$

In Equation 11, $\gamma_{coef}^{dec}(s)$ denotes an XOR operation coefficient for decoding, and is different based on the hardware performance of a device that executes raptor decoding. $\gamma_{coef}^{dec}(s)$ may be previously calculated in a receiving side, and subsequently, may be transmitted to a transmitting side, during an MPMTP handshake.

In Equation 11, $\widetilde{XOR}_{byte}^{dec}(s,k)$ denotes an approximated amount of byte on which XOR is executed for raptor decoding. A system according to an embodiment of the present disclosure calculates an XOR operation coefficient before communication begins.

Figure 6:
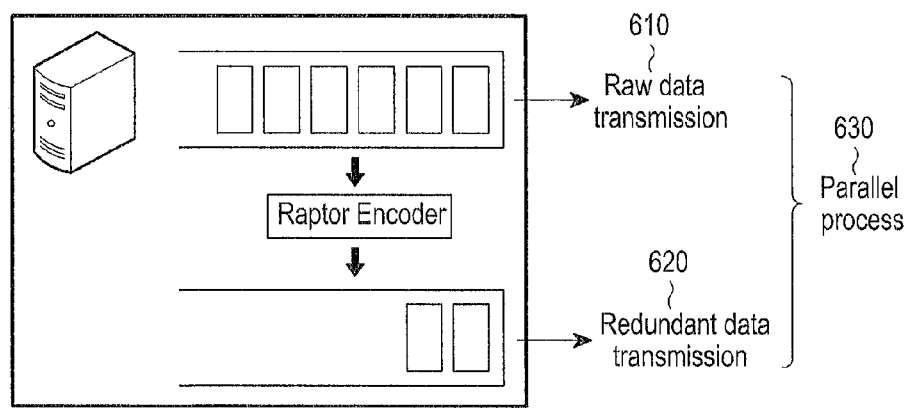
FIG. 6 illustrates a packet distribution method in a packet distributor of a mobile communication system according to an embodiment of the present disclosure.

FIG. 6 illustrates a packet distribution method in a packet distributor of a mobile communication system according to an embodiment of the present disclosure.

As illustrated in FIG. 6, the system according to an embodiment of the present disclosure transmits a general (raw) packet 610, and in parallel, executes raptor encoding when the general packet is sufficiently buffered in a raptor encoder, so as to generate and transmit a redundant packet 620. That is, data transmission and raptor encoding are executed as a parallel process 630. In this instance, general packets are transmitted through multiple paths and, thus, information associated with a transmission path of a general packet is required or used to determine an efficient code rate. Therefore, the system, according to an embodiment of the present disclosure, transmits a general packet first, determines a code rate based on path information of the transmitted packet, and executes raptor encoding, so as to transmit a redundant packet. In this instance, for the general packet, it is important that the general packets arrive in order. However, for the redundant packet, the number of packets that arrive is important, irrespective of the order of arrival. A packet distributor, configured in consideration of the system structure, includes the following two stages, which will be described with reference to FIGS. 7A and 7B.

Figure 7A:
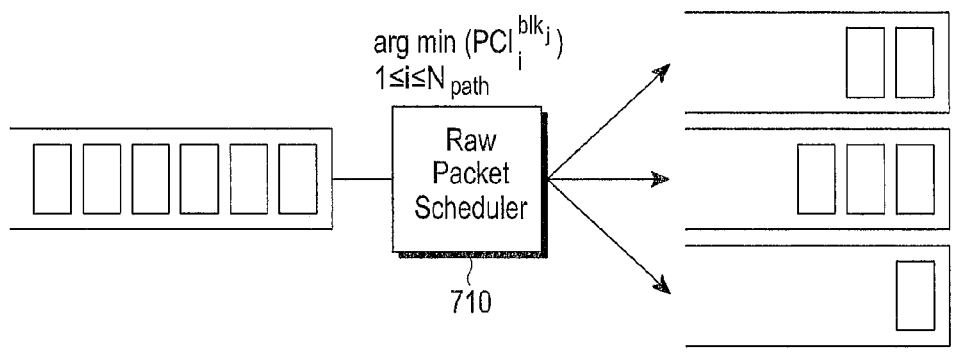
FIG. 7A illustrates a general packet scheduling method.
Figure 7B:
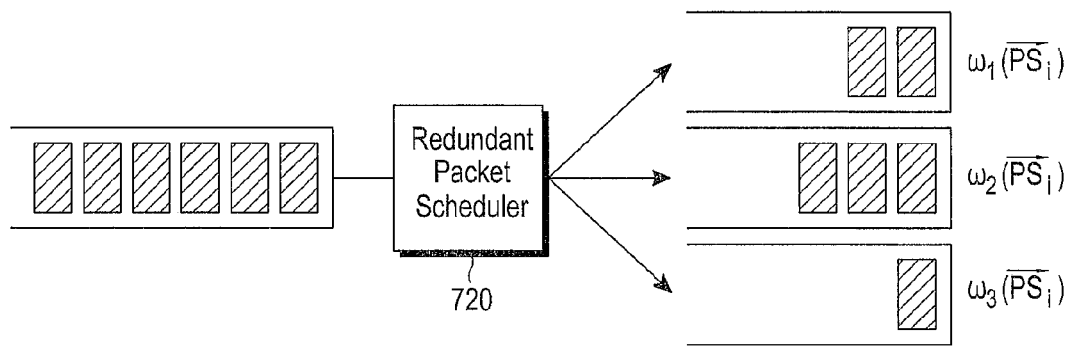
FIG. 7B illustrates a redundant packet scheduling method.

FIG. 7A illustrates a general packet scheduling method, and FIG. 7B is a diagram illustrating a redundant packet scheduling method.

(1) General packet distribution: A general packet scheduler 710 schedules a general packet to be transmitted through a path having the lowest Path Cost Indicator (PCI). In the transmission of a $j^{th}$ block, a PCI of an $i^{th}$ path is defined by the following Equation 13.

$$PCI_i^{blk} = \frac{(n_{buf_i}^{blk} + 1) \cdot P^{size}}{\widetilde{tr}_i^{TFRC} \cdot (1 - plr_i^W)} + \frac{(n_{buf_i}^{total} - n_{buf_i}^{blk}) \cdot P^{size}}{\widetilde{tr}_i^{TFRC}} + d_i \quad \text{[Equation 13]}$$

$$\widetilde{tr}_i^{TFRC} = tr_i^{TFRC} \cdot \frac{r_i^{sqmean}}{\sqrt{r_i}},$$

A packet scheduling vector for general data is determined by the PCI.

In Equation 13, $P^{size}$ denotes a size of a packet, $\widetilde{tr}_i^{TFRC}$ denotes a bandwidth of the $i^{th}$ path, $d_i$ denotes a delay of the $i^{th}$ path, $plr_i^W$ denotes a PLR of the $i^{th}$ path. $n_{buf_i}^{blk}$ denotes the number of packets corresponding to the jth block among the packets included in an $i^{th}$ path buffer, and $n_{buf_i}^{total}$ denotes the number of existing packets included in the $i^{th}$ path buffer. The structure of the general packet distributor is as shown in FIG. 7A. In this manner, for the $j^{th}$ block, a packet scheduling vector for a general packet may be determined through $PCI_i^{blk}$, as follows.

$$\overrightarrow{PS}(s,k) = (ps_1, ps_2, \ldots, ps_{p^{num}(s,k)}) \quad \text{[Equation 14]}$$

In Equation 14, $ps_i$ denotes an index of a path through which the $i^{th}$ packet is to be transmitted, and $p^{num}(s,k)$ denotes the number of packets in a source block $\lceil (s \cdot k)/P^{size} \rceil$.

(2) Redundant packet distribution: A redundant packet scheduler 720 schedules a redundant packet to be transmitted using a weighted round robin scheme based on a packet distribution vector of the general packet. A weight of the $i^{th}$ path of the $j^{th}$ block is determined as follows.

$$\omega_i(\overrightarrow{PS}(s,k)) = \frac{\sum_{j=1}^{|\overrightarrow{PS}(s,k)|} psv_{ij}(\overrightarrow{PS}(s,k))}{|\overrightarrow{PS}(s,k)|} \quad \text{[Equation 15]}$$

$$psv_{ij}(\overrightarrow{PS}(s,k)) = \begin{cases} 1 & \text{if } ps_j = i \\ 0 & \text{otherwise} \end{cases} \quad \text{[Equation 16]}$$

When the weight of the path is determined based on Equation 15, the packet scheduler transmit the redundant packet based on the weighted round robin, as shown in FIG. 7B. This process is repeated for each encoded block.

4. Determination of Raptor Code Rate

A raptor code rate is determined based on a packet distribution vector of a general packet and a PLR of each path. The PLR of each path is based on Gaussian distribution. An embodiment of the present disclosure suggests a method of measuring a PLR based on a packet distribution vector before determining a code rate. It is assumed that each path is independently separated in a system according to an embodiment of the present disclosure. In this instance, the PLR of the $i^{th}$ path is modeled in a normal distribution as shown in Equation 17.

$$PLR_i \sim N(\mu_{PLR_i}, \sigma_{PLR_i}^2), \quad \text{[Equation 17]}$$

In Equation 17, $PLR_i$ denotes a PLR random parameter of the $i^{th}$ path, and $\mu_{PLR_i}$ and $\sigma_{PLR_i}$ indicate an average value and a variance value of the PLR of the $i^{th}$ path, respectively. Based on a random variable of a PLR of each path and a packet distribution vector $\overrightarrow{PS}$ of a general packet, a random variable of a total PLR may be calculated as shown in Equation 18.

$$PLR^{total} = \omega_1(\vec{PS}) \cdot PLR_1 + \omega_2(\vec{PS}) \cdot PLR_2 + \ldots + \omega_{N^{path}}(\vec{PS}) \cdot PLR_{N^{path}} \quad \text{[Equation 18]}$$

$$= \sum_{i=1}^{N^{path}} \omega_i(\vec{PS}) \cdot PLR_i \sim N\left(\sum_{i=1}^{N^{path}} \omega_i(\vec{PS}) \cdot \mu_{PLR_i}, \sum_{i=1}^{N^{path}} \left(\omega_i(\vec{PS}) \cdot \sigma_{PLR_i}\right)^2\right)$$

In Equation 18, $N^{path}$ denotes the number of available paths.

A PLR ($plr^{total}(\vec{PS})$) may be calculated by applying Q function to Equation 18 and considering all of the paths within an error rate of $\rho_{err}$, as shown in Equation 19.

$$plr^{total}(\vec{PS}) = \quad \text{[Equation 19]}$$

$$\sqrt{\sum_{i=1}^{N^{path}} \left(\omega_i(\vec{PS}) \cdot \sigma_{PLR_i}\right)^2} \cdot Q^{-1}(\rho^{err}) + \sum_{i=1}^{N^{path}} \omega_i(\vec{PS}) \cdot \mu_{PLR_i}$$

A decoding failure rate of a raptor code may be calculated based on the total PLR calculated in Equation 19. When a size of a symbol is s, the number of source symbols is k, and a code rate is c, the raptor decoding failure rate ($\phi^{dec}(s,k,c,\vec{PS})$) may be estimated using a binomial distribution, as shown in Equation 20.

$$\varphi^{dec}(s, k, c, \vec{PS}) = \quad \text{[Equation 20]}$$

$$P(X < p^{min}(s, k) | X \sim B(p^{enc}(s, k, c), 1 - plr^{total}(\vec{PS}))) =$$

$$\sum_{i=0}^{p^{min}(s,k)-1} \left(\binom{p^{enc}(s, k, c)}{i} (1 - plr^{total}(\vec{PS}))^i \right.$$

$$\left. (plr^{total}(\vec{PS}))^{p^{enc}(s,k,c)-i}\right),$$

$$p^{min}(s, k) = \left\lceil \frac{((1 + \delta(k, \tau^{succ})) \cdot s \cdot k)}{P^{size}} \right\rceil,$$

$$p^{enc}(s, k, c) = \left\lceil \frac{1}{P^{size}} \cdot \frac{s \cdot k}{c} \right\rceil,$$

In Equation 20, $\phi^{dec}(s,k,c,\vec{PS})$ denotes a decoding failure rate of a raptor code, $p^{min}(s,k)$ denotes the number of packets required or used for successful raptor decoding, and $p^{enc}(s,k,c)$ denotes the number of packets in an encoded block.

The raptor code rate may be determined based on the decoding failure rate of the raptor code, as shown in Equations 21 and Equation 22.

$$c(\vec{PS}) = \underset{0 < c \leq 1}{\operatorname{argmin}} \{c^{diff}(\vec{PS}, c)\} \quad \text{[Equation 21]}$$

$$c^{diff}(\vec{PS}, c) = \quad \text{[Equation 22]}$$

$$\begin{cases} \Phi^{max} - \varphi^{dec}(s, k, c, \vec{PS}) & \text{if } \varphi^{dec}(s, k, c, \vec{PS}) \leq \Phi^{max} \\ \infty & \text{otherwise} \end{cases}.$$

In Equation 22, $\Phi^{max}$ denotes an allowable raptor decoding failure rate.

5. Determination of a Raptor Encoding Parameter

A size of a symbol and the number of source symbols included in a block, which are raptor encoding parameters, may significantly affect the raptor encoding performance. The number of source symbols is determined based on the performance of a device, a network state, and a buffer state of a receiving end. The size of the symbol and the number of source symbols included in a block according to an embodiment of the present disclosure are determined by Equation 23. That is, the size s of the symbol and the number k of the symbols that minimize or sufficiently reduce a cost function $\Omega(s,k)$ may be determined by Equation 23.

$$\frac{1}{p^{num}(s, k)} \cdot \left( enc^{time}(s, k, c(\vec{PS}(s, k))) + \right. \quad \text{[Equation 23]}$$

$$\left. \max_{1 \leq i \leq N^{path}} \left( \frac{\omega_i(\vec{PS}(s, k)) \cdot p^{enc}(s, k, c(\vec{PS}(s, k))) \cdot P^{size}}{\tilde{tr}_i^{TFRC}} \right) \right),$$

subject to $s \in S^{size}, k \in K^{num}$, $$enc^{time}(s, k, c(\vec{PS}(s, k))) + \tilde{dec}^{time}(s, k) + \quad \text{[Equation 24]}$$

$$\max_{1 \leq i \leq N^{path}} \left( \frac{(\omega_i(\vec{PS}(s, k)) \cdot p^{enc}(s, k, c(\vec{PS}(s, k))) + n_{buf_i}^{total}) \cdot P_{size}}{\tilde{tr}_i^{TFRC}} + d_i \right) \leq$$

$$\frac{\chi \cdot buf^{recv}}{VR}$$

In Equation 24, $enc^{time}(s,k,c(\vec{PS}(s,k)))$ denotes a raptor encoding time, $\tilde{dec}^{time}(s,k)$ denotes an approximated raptor decoding time in a receiving side, and $\chi$ is constant between 0 and 1.

In Equation 24, $S^{sise}$ denotes a set of available symbol sizes and is expressed as $S^{size}=\{s_0^{size}, s_1^{size}, \ldots, s_{|S^{size}|}^{size}\}$, and $K^{num}$ denotes a set of available numbers indicating the number of source symbols and is expressed as $K^{num}=\{k_0^{num}, k_1^{num}, \ldots, k_{|K^{num}|}^{num}\}$ $p^{num}(s_i^{size}, s_i^{num})$ denotes the number of source packets, $p^{enc}(s,k,c(\vec{PS}(s,k))) \cdot P^{size}$ denotes a size of an encoded block, $buf^{recv}$ denotes an amount of data of a buffer of a receiving end, VR and denotes a bit rate of an image. The size of the symbol and the number of source symbols included in a block according to an embodiment of the present disclosure are obtained by calculating an overhead per source packet based on a raptor encoding time and a multiple-path transmission delay, as shown in Equation 23. Equation 24 is a constraint for preventing underflow in the buffer of the receiving end. A system according to another embodiment of the present disclosure uses the Lagrange multiplier method. A penalty function may be defined by Equation 25 and Equation 26, based on Equation 23 and Equation 24.

$$PF(s,k)=\Omega(s,k)+\lambda \cdot \max(\psi(s,k),0) \quad \text{[Equation 25]}$$

$$\Psi(s,k) = \quad \text{[Equation 26]}$$

$$\left\{ \begin{array}{l} enc^{time}(s, k, c(\vec{PS}(s,k))) + \tilde{dec}^{time}(s,k) + \\ \max_{1 \leq i \leq N^{path}} \left( \frac{(\omega_i(\vec{PS}(s,k)) \cdot P^{enc}(s,k,c(\vec{PS}(s,k))) + n_{buf_i}^{total}) \cdot P^{size}}{\tilde{tr}_i^{TFRC}} + d_i \right) \end{array} \right\} - \frac{\chi \cdot buf^{recv}}{VR}$$

In Equation 26, $\lambda$ denotes a Lagrange multiplier. s and k that satisfy the constraint of Equation 23 and simultaneously minimize or sufficiently reduce the penalty function $PF(s,k)$, may be the optimal raptor encoding parameters.

6. Raptor Encoding Parameter Determining Algorithm

Hereinafter, s denotes $S_i^{size}$, k denotes $S_i^{num}$, and $C_i$ denotes a code rate, that is, c.

Figure 8:
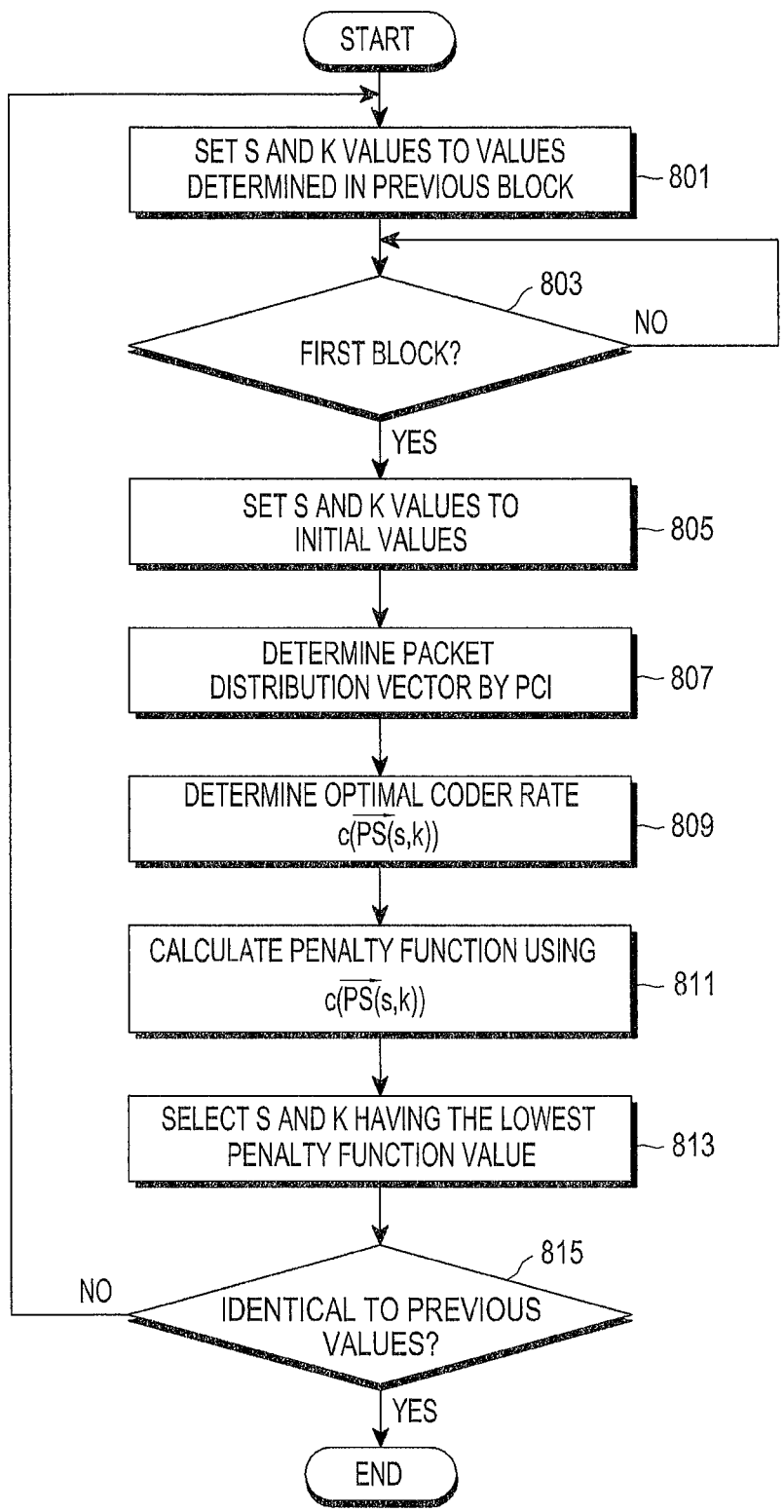
FIG. 8 is a flowchart illustrating a method of determining an optimal raptor encoding parameter according to an embodiment of the present disclosure.

The penalty function $\Omega(s,k)$ is expressed in a form of a convex function. Accordingly, optimal values may be obtained by repeatedly executing a process that selects s and k which have the lowest penalty function value from among s and k values from any s and k values to adjacent s and k values included in $S^{size}$ and $K^{num}$ FIG. 8 is a flowchart illustrating a method of determining an optimal raptor encoding parameter according to an embodiment of the present disclosure. A detailed algorithm of determining optimal s and k is as follows.

In operation 801, a controller sets s, k, and $\lambda$ values to values determined in a previous block. In operation 803, the controller determines whether a current block is a first block. When the block is different from the first block, the controller executes operation 801. However, when the block is the first block, the controller set the s, k, $\lambda$ values to initial values, that is, $s_0^{size}$, $k_0^{num}$, and $\lambda^{init}$. A set $V^{visit}$ of visited symbol parameters and a set $V^{end}$ of candidate symbol parameters are empty. When s and k are included in $V^{visit}$, the controller skips operation 807. Conversely, when s and k are not included in $V^{visit}$, the controller determines a packet distribution vector $\vec{PS}(s,k)$ of a source symbol based on the PCI (Equation 13). In operation 809, the controller determines an optimal code rate $c(\vec{PS}(s,k))$ of which a raptor decoding failure rate is less than or equal to $\Phi^{max}$, based on the determined $\vec{PS}(s,k)$.

In operation 811, the controller calculates a penalty function $\Omega(s,k)$ based on the value $c(\vec{PS}(s,k))$ determined in operation 809. s and k are added to $V^{visit}$ and $V^{end}$. In operation 809, when currently selected s and k correspond to $s_i \in S^{size}$ and $k_i^{num} \in K^{num}$, operations 801 through 811 are repeatedly executed with respect to adjacent $(s_{i+1}^{size}, k_i^{num})$, $(s_i^{size}, k_{i-1}^{num})$, $(s_{i-1}^{size}, k_i^{num})$, and $(s_i^{size}, k_{i-1}^{num})$. In operation 813, the controller selects s and k which have the lowest penalty function value from $V^{end}$. When the selected s and k fail to satisfy the penalty function equation, the selected s and k are updated as shown in Equation 27.

$$\lambda = \lambda + \Delta\lambda, \quad \text{[Equation 27]}$$

$$\Delta\lambda = PF(s,k) \Big/ \frac{\chi \cdot buf^{recv}}{VR}$$

After selecting the s and k values, the controller determines whether s and k are identical to previous values in operation 815. When the values are identical to the previous values, the controller terminates the algorithm. When the values are different from the previous values, the controller repeats operations from operation 801 with respect to the selected s and k (or adjacent s and k).

When a general unsystematic fountain code, excluding the raptor code, is used, a method of calculating complexity will be described with reference to FIGS. 9A and 9B.

Figure 9B:
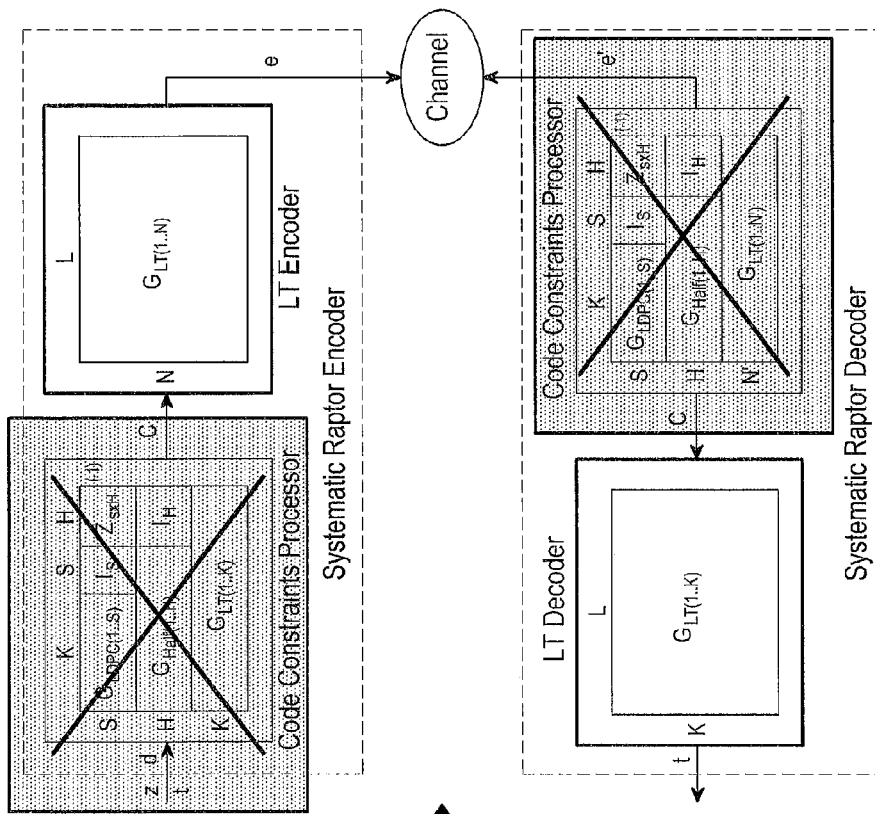
FIGS. 9A and 9B illustrate a system when a general unsystematic fountain code excluding the raptor code is used.
Figure 9A:
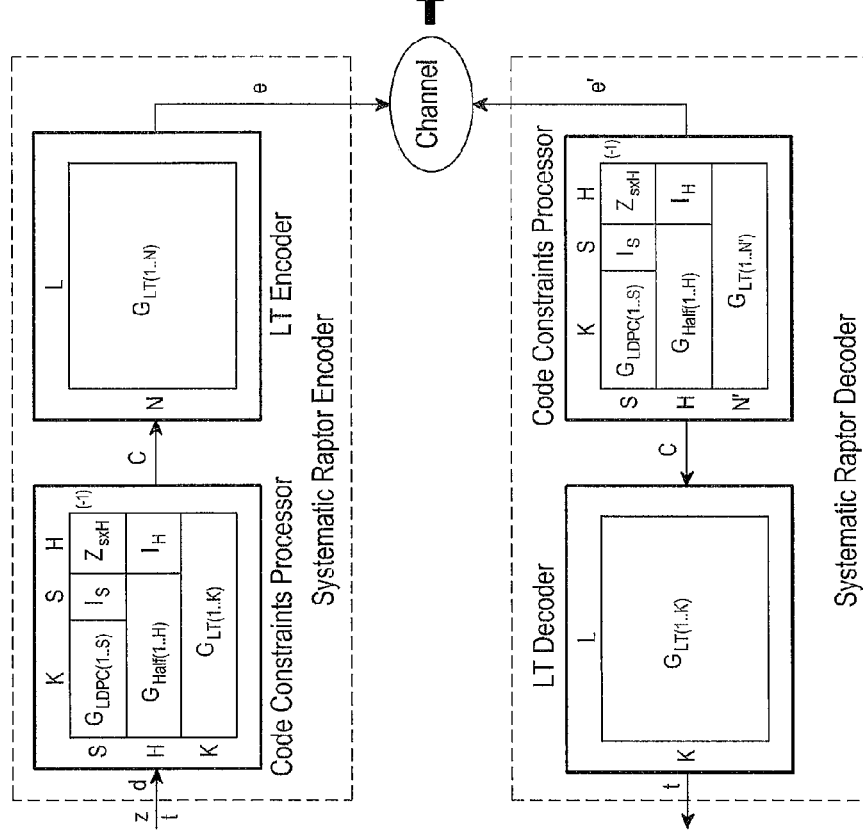

Referring to FIGS. 9A and 9B, when a general unsystematic fountain code excluding the raptor code is used, encoding is executed based on an LT code, and a Code Constraints Processor (CCP) is not needed. Other fountain codes may have the identical process. An LT encoding time may be linearly modeled based on an amount of symbol on which XOR is executed. Here, the LT matrix may be extracted using a memory, may be given in a transmitting apparatus, or may be generated in the transmitting apparatus.

When the number of source symbols is $S_i^{num}$ and a code rate is $C_i$, the number of times of XOR of the LT matrix ($G^{LT_{enc}}$) for encoding is as follows.

$$XOR^{LT_{enc}}(s_i^{num}, c_i) = \sum_{j=1}^{N(s_i^{num}, c_i)} \sum_{k=1}^{L(s_i^{num})} g_{jk}^{LT_{enc}} \quad \text{[Equation 28]}$$

When a size of a symbol is $S_i^{size}$ based on Equation 28, the LT encoding time may be calculated as shown in Equation 29 and Equation 30.

$$enc^{time}(s_i^{size}, s_i^{num}, c_i) = \gamma_{coef}^{enc}(s_i^{size}) \cdot XOR_{byte}^{enc}(s_i, s_i^{num}, c_i)$$ [Equation 29]

$$XOR_{byte}^{enc}(s_i^{size}, s_i^{num}, c_i) = s_i^{size} \cdot XOR^{LTenc}(s_i^{num}, c_i)$$ [Equation 30]

In Equation 29, $\gamma_{coef}^{enc}(s_i^{size})$ denotes an XOR operation coefficient for encoding, and is different based on the hardware performance of a device that executes LT encoding. A system according to an embodiment of the present disclosure calculates an XOR operation coefficient before communication begins.

When the number of source symbols is $s_i^{num}$ and a code rate is $C_i$, the number of times of XOR of the LT matrix ($G^{LTdec}$) for decoding is as shown in Equation 31.

$$XOR^{LTdec}(s_i^{num}) = \sum_{j=1}^{s_i^{num}} \sum_{k=1}^{L(s_i^{num})} g_{jk}^{LTdec}$$ [Equation 31]

When a size of a symbol is $S_i^{size}$ based on Equation 31, an LT decoding time may be calculated as shown in Equation 32 and Equation 33.

$$dec^{time}(s_i^{size}, s_i^{num}) = \gamma_{coef}^{dec}(s_i^{size}) \cdot XOR_{byte}^{dec}(s_i^{size}, s_i^{num})$$ [Equation 32]

$$XOR_{byte}^{dec}(s_i^{size}, s_i^{num}) = s_i^{size} \cdot XOR^{LTdec}(s_i^{num})$$ [Equation 33]

In Equation 32, $\gamma_{coef}^{dec}(s_i^{size})$ denotes an XOR operation coefficient for decoding, and is different based on the hardware performance of a device that executes LT decoding. A system according to an embodiment of the present disclosure calculates an XOR operation coefficient before communication begins.

A transmitter for LT decoding may fail to calculate $XOR^{LTdec}(s_i^{num})$ due to the packet loss. Accordingly, $XOR^{LTdec}(s_i^{num})$ may be calculated as shown in Equation 34.

$$\widetilde{XOR}_{byte}^{dec}(s_i^{size}, s_i^{num}) = s_i^{size} \cdot \widetilde{XOR}^{LTdec}(s_i^{num})$$

$$\widetilde{dec}^{time}(s_i^{size}, s_i^{num}) = \gamma_{coef}^{dec}(s_i^{size}) \cdot \widetilde{XOR}_{byte}^{dec}(s_i^{size}, s_i^{num})$$ [Equation 34]

Figure 10A:
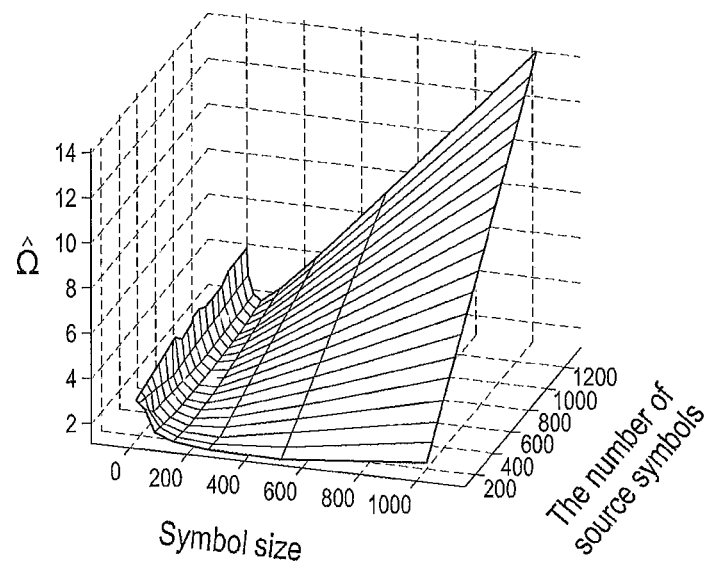
FIGS. 10A and 10B are graphs illustrating a result of a simulation of Equation 25 and Equation 26.
Figure 10B:
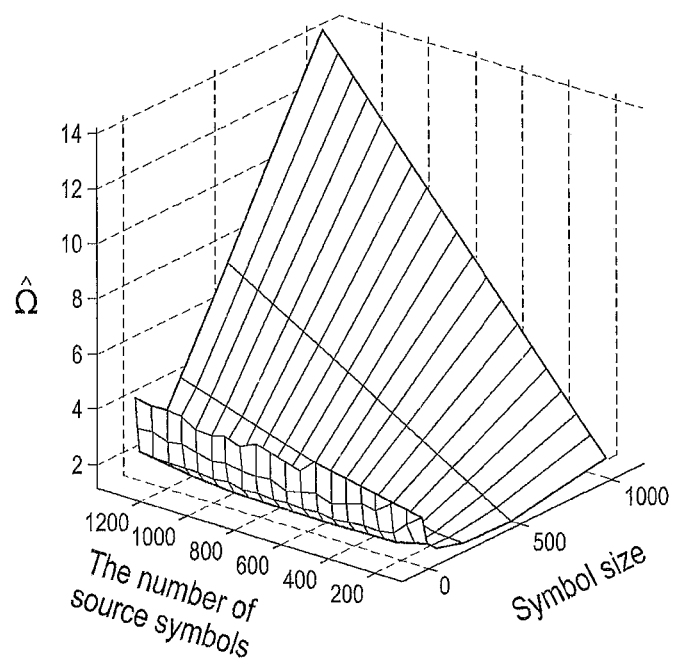

FIGS. 10A and 10B are graphs illustrating simulation results of Equation 25 and Equation 26. Optimal $s_i^{size}$ and $s_i^{num}$ are selected as results of simulation and thus, the minimum or sufficiently reduced costs may be selected.

A system according to an embodiment of the present disclosure may have various network interfaces, such as 3G, LTE, and the like, in addition to WiFi. In those circumstances, when an image is not smoothly streamed through a single network due to a great number of users, the image may be stably streamed using multiple paths. The present disclosure may use a raptor code to restore a packet loss caused by interference of a wireless channel, so as to satisfy the request from a user, and may set an optimal raptor encoding parameter based on a user terminal or network environments, so as to smoothly stream an image, as compared to the conventional technologies.

Although the method has been described based on the specific embodiments, the method may be implemented as computer readable codes in a computer readable recording medium. The computer-readable recording medium includes all types of recording devices which store data readable by a computer system. Examples of the computer-readable recording medium include a ROM, a RAM, a CD-ROM, a magnetic tape, a floppy disk, an optical data storage device, and the like, and includes implementations in the form of a carrier wave (for example, transmission through the Internet). The computer readable recording medium may be dispersed to computer systems connected to one another through a network, and store and execute computer readable codes in a dispersion manner. Further, functional programs, codes and code segments for the implementation of the embodiments may be easily inferred by programmers in the art which the present disclosure pertains to.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method of transmitting multimedia data in a mobile communication system, the method comprising:
   determining a packet distribution vector by a path cost indicator (PCI) determined based on a size of a packet and a bandwidth of a path;
   determining a code rate based on the packet distribution vector;
   calculating a penalty function based on the code rate;
   determining, for each block, a size of a source symbol and a number of source symbols which satisfy a lowest value for the calculated penalty function based on an overhead value per packet calculated by using a raptor encoding time and a multiple-path transmission delay, and a constraint for preventing underflow in a buffer of a receiving end; and
   transmitting encoded multimedia data based on the size of the source symbol and the number of source symbols.

2. The method of claim 1, wherein the PCI is determined based on a following equation:

$$PCI_i^{blk} = \frac{(n_{buf_i}^{blk} + 1) \cdot P^{size}}{\tilde{tr}_i^{TFRC} \cdot (1 - plr_i^W)} + \frac{(n_{buf_i}^{total} - n_{buf_i}^{blk}) \cdot P^{size}}{\tilde{tr}_i^{TFRC}} + d_i$$

$$\tilde{tr}_i^{TFRC} = tr_i^{TFRC} \cdot \frac{r_i^{sqmean}}{\sqrt{r_i}},$$

wherein $PCI_i^{blk}$ denotes the PCI of an $i^{th}$ path, $P_{size}$ denotes a size of a packet, $\tilde{tr}_i^{TFRC}$, $tr_i^{TFRC}$ denotes a bandwidth of the $i^{th}$ path, $d_i$ denotes a delay of the $i^{th}$ path, $plr_i^W$ denotes a packet loss of the $i^{th}$ path, $n_{buf_i}^{blk}$ denotes a number of packets corresponding to a $j^{th}$ block among the packets included in an $i^{th}$ path buffer, $tr^{TFRC}$ denotes a transmission rate determined using a TCP-friendly rate control (TFRC) algorithm, r denotes a Round Trip Time (RTT), and $n_{buf_i}^{total}$ denotes a number of existing packets included in the $i^{th}$ path buffer.

3. The method of claim 1 wherein the size of the source symbol and the number of the source symbols, satisfying that has the lowest value for the calculated penalty function, are determined based on a following equation:

$$\frac{1}{p^{num}(s, k)} \cdot \left( enc^{time}(s, k, c(\vec{PS}(s, k))) + \max_{1 \leq i \leq N^{path}} \left( \frac{\omega_i(\vec{PS}(s, k)) \cdot p^{enc}(s, k, c(\vec{PS}(s, k))) \cdot P^{size}}{\tilde{tr}_i^{TFRC}} \right) \right),$$

subject to $s \in S^{size}$, $k \in K^{num}$,

-continued $$enc^{time}(s, k, c(\overrightarrow{PS}(s,k))) + \widetilde{dec}^{time}(s, k) +$$

$$\max_{1 \le i \le N^{path}} \left( \frac{(\omega_i(\overrightarrow{PS}(s,k)) \cdot p^{enc}(s, k, c(\overrightarrow{PS}(s,k))) + n_{buf_i}^{total}) \cdot P_{size}}{\widetilde{tr}_i^{TFRC}} + d_i \right) \le$$

$$\frac{\chi \cdot buf^{recv}}{VR},$$

wherein s denotes the size of the source symbol, k denotes the number of the source symbols, $enc^{time}$ (s,k,c $(\overrightarrow{PS}(s,k))$) denotes the raptor encoding time, $\widetilde{dec}^{time}$ (s,k) denotes an approximated raptor decoding time in the receiving end, and x denotes constant between 0 and 1, $\widetilde{tr}_i^{TFRC}$ $_i^{TFRC}$ denotes a bandwidth of an $i^{th}$ path, $n_{buf_i}^{total}$ denotes a number of existing packets included in an $i^{th}$ path buffer, $\omega_i(\overrightarrow{PS}(s,k))$ denotes a weight used by a scheduler, $p^{enc}(s,k,c)$ denotes an number of packets in an encoded block, $s^{size}$ denotes a set of available symbol sizes, $K^{num}$ denotes a set of available numbers indicating the number of source symbols, $p^{num}(s,k)$ denotes a number of source packets, $p^{enc}(s,k,c(\overrightarrow{PS}(s,k))) \cdot p^{size}$ denotes a size of an encoded block, $buf^{recv}$ denotes an amount of data of the buffer of the receiving end, and VR denotes a bit rate of an image.

4. The method of claim 3, wherein the raptor encoding time is determined based on a following equation:

$$enc^{time}(s,k,c) = \gamma_{coef}^{enc}(s) \cdot XOR_{byte}^{enc}(s,k,c),$$

wherein $enc^{time}(s,k,c)$ denotes the raptor encoding time, of $\gamma_{coef}^{enc}(s)$ denotes an XOR operation coefficient for encoding, and $XOR_{byte}^{enc}$ (s,k,c) denotes a time when XOR is executed on a symbol based on a previously generated matrix.

5. The method of claim 4, wherein the previously generated matrix is a Code Constraints Processor/Luby Transform (CCP/LT) matrix, and the time when XOR is executed on the symbol based on the CCP/LT matrix is defined by a following equation:

$$XOR_{byte}^{enc}(s,k,c) = s \cdot (XOR^{CCP^{enc}}(k) + XOR^{LT^{enc}}(k,c))$$

wherein s denotes the size of the source symbol, k denotes the number of the source symbols, c denotes a code rate, $XOR_{byte}^{enc}(s,k,c)$ denotes an amount of bye on which XOR is executed for encoding, $XOR^{CCP^{enc}}$ denotes a number of times of XOR of a CCP matrix for encoding, and $XOR^{LT^{enc}}$ denotes a number of times of XOR of a LT matrix for encoding.

6. A multimedia data transmitting apparatus in a mobile communication system, the apparatus comprising:
a controller configured to determine a packet distribution vector by a path cost indicator (PCI) determined based on a size of a packet and a bandwidth of a path, to determine a code rate based on the packet distribution vector, to calculate a penalty function based on the code rate, and to determine, for each block, a size of a source symbol and a number of the source symbols which satisfy a lowest value for the calculated penalty function based on an overhead value per packet calculated by using a encoding time and a multiple-path transmission delay, and a constraint for preventing underflow in a buffer of a receiving end; and
a transmitter configured to transmit encoded multimedia data based on the size of the source symbol and the number of the source symbols.

7. The apparatus of claim 6, wherein the PCI is determined based on a following equation:

$$PCI_i^{blk} = \frac{(n_{buf_i}^{blk}+1) \cdot P^{size}}{\widetilde{tr}_i^{TFRC} \cdot (1 - plr_i^W)} + \frac{(n_{buf_i}^{total} - n_{buf_i}^{blk}) \cdot P^{size}}{\widetilde{tr}_i^{TFRC}} + d_i$$

$$\widetilde{tr}_i^{TFRC} = tr_i^{TFRC} \cdot \frac{r_i^{sqmean}}{\sqrt{r_i}},$$

wherein $PCI_i^{blk}$ denotes the PCI of an $i^{th}$ path, $P_{size}$ denotes a size of a packet, $\widetilde{tr}_i^{TFRC}$ $_i^{TFRC}$ denotes a bandwidth of the $i^{th}$ path, $d_i$ denotes a delay of the $i^{th}$ path, $plr_i^W$ denotes a packet loss of the $i^{th}$ path, $n_{buf_i}^{blk}$ denotes a number of packets corresponding to a $j^{th}$ block among the packets included in an $i^{th}$ path buffer, $tr^{TFRC}$ denotes a transmission rate determined using a TCP-friendly rate control (TFRC) algorithm, r denotes a Round Trip Time (RTT), and $n_{buf_i}^{total}$ denotes a number of existing packets included in the $i^{th}$ path buffer.

8. The apparatus of claim 6, wherein the size of the source symbol and the number of source symbols, satisfying that has the lowest value for the calculated penalty function, are determined based on a following equation:

$$\frac{1}{p^{num}(s,k)} \cdot \left( enc^{time}(s, k, c(\overrightarrow{PS}(s,k))) + \max_{1 \le i \le N^{path}} \left( \frac{\omega_i(\overrightarrow{PS}(s,k)) \cdot p^{enc}(s, k, c(\overrightarrow{PS}(s,k))) \cdot P^{size}}{\widetilde{tr}_i^{TFRC}} \right) \right),$$

subject to $s \in S^{size}, k \in K^{num}$, $$enc^{time}(s, k, c(\overrightarrow{PS}(s,k))) + \widetilde{dec}^{time}(s, k) +$$

$$\max_{1 \le i \le N^{path}} \left( \frac{(\omega_i(\overrightarrow{PS}(s,k)) \cdot p^{enc}(s, k, c(\overrightarrow{PS}(s,k))) + n_{buf_i}^{total}) \cdot P_{size}}{\widetilde{tr}_i^{TFRC}} + d_i \right) \le$$

$$\frac{\chi \cdot buf^{recv}}{VR},$$

wherein s denotes the size of the source symbol, k denotes the number of the source symbols, $enc^{time}$ (s,k,c $(\overrightarrow{PS}(s,k))$) denotes the raptor encoding time, $\widetilde{dec}^{time}$ (s,k) denotes an approximated raptor decoding time in the receiving end, and x denotes constant between 0 and 1, $\widetilde{tr}_i^{TFRC}$ $_i^{TFRC}$ denotes a bandwidth of an $i^{th}$ path, $n_{buf_i}^{total}$ denotes a number of existing packets included in an $i^{th}$ path buffer, $\omega_i(\overrightarrow{PS}(s,k))$ denotes a weight used by a scheduler, $p^{enc}$ denotes the number of packets in an encoded block, $s^{size}$ denotes a set of available symbol sizes, $K^{num}$ denotes a set of available numbers indicating a number of source symbols, $p^{num}(s,k)$ denotes a number of source packets, $p^{enc}(s,k,c(\overrightarrow{PS}(s,k))) \cdot p^{size}$ denotes a size of an encoded block, $buf^{recv}$ denotes an amount of data of the buffer of the receiving end, and VR denotes a bit rate of an image.

9. The apparatus of claim 8, wherein the raptor encoding time is determined based on a following equation:

$$enc^{time}(s,k,c) = \gamma_{coef}^{enc}(s) \cdot XOR_{byte}^{enc}(s,k,c)$$

wherein $enc^{time}(s,k,c)$ denotes the raptor encoding time, $\gamma_{coef}^{enc}$ denotes an XOR operation coefficient for encoding, and $XOR_{byte}^{enc}(s,k,c)$ denotes a time when XOR is executed on a symbol based on a previously generated matrix.

10. The apparatus of claim 9, wherein the previously generated matrix is a Code Constraints Processor/Luby Transform (CCP/LT) matrix, and the time when XOR is executed on the symbol based on the CCP/LT matrix is defined by a following equation:

$$XOR_{byte}^{enc}(s,k,c) = s \cdot (XOR^{CCP^{enc}}(k) + XOR^{LT^{enc}}(k,c))$$

wherein s denotes the size of the source symbol, k denotes the number of the source symbols, c denotes a code rate, $XOR^{CCP^{enc}}$ denotes a number of times of XOR of a CCP matrix for encoding, and $XOR^{LT^{enc}}$ denotes a number of times of XOR of a LT matrix for encoding.

11. A method of receiving multimedia data in a mobile communication system, the method comprising:

demodulating multimedia data transmitted from a transmitter;

determining a size of a source symbol and a number of source symbols, for each block, from the demodulated multimedia data;

decoding the multimedia data based on the determined size of the source symbol and the determined number of source symbols, wherein determining of the size of the source symbol and the number of source symbols for each block comprises:

determining a packet distribution vector by a path cost indicator (PCI) determined based on a size of a packet and a bandwidth of a path, determining a code rate based on the packet distribution vector, calculating a penalty function based on the code rate, and determining, for each block, the size of the source symbol and the number of the source symbols which satisfy a lowest value for the calculated penalty function based on an overhead value per packet calculated by using a raptor encoding time and a multiple-path transmission delay, and a constraint for preventing underflow in a buffer of a receiving end.

12. The method of claim 11, wherein the PCI is determined based on a following equation:

$$PCI_i^{blk} = \frac{(n_{buf_i}^{blk}+1) \cdot P^{size}}{\tilde{tr}_i^{TFRC} \cdot (1-plr_i^W)} + \frac{(n_{buf_i}^{total}-n_{buf_i}^{blk}) \cdot P^{size}}{\tilde{tr}_i^{TFRC}} + d_i$$

$$\tilde{tr}_i^{TFRC} = tr_i^{TFRC} \cdot \frac{r_i^{sqmean}}{\sqrt{r_i}},$$

wherein $PCI_i^{blk}$ denotes the PCI of an $i^{th}$ path, $P_{size}$ denotes a size of a packet, $\tilde{tr}_i^{TFRC}$ $^{TFRC}$ denotes a bandwidth of the $i^{th}$ path, $d_i$ denotes a delay of the $i^{th}$ path, $plr_i^W$ denotes a packet loss of the $i^{th}$ path, $n_{buf_i}^{blk}$ denotes a number of packets corresponding to a $j^{th}$ block among the packets included in an $i^{th}$ path buffer, $tr^{TFRC}$ denotes a transmission rate determined using a TCP-friendly rate control (TFRC) algorithm, r denotes a Round Trip Time (RTT), and $n_{buf_i}^{total}$ denotes a number of existing packets included in the $i^{th}$ path buffer.

13. The method of claim 11, wherein the size of the source symbol and the number of source symbols, satisfying that has the lowest value for the calculated penalty function, are determined based on a following equation:

$$\frac{1}{p^{num}(s,k)} \cdot \left( enc^{time}(s,k,c(\vec{PS}(s,k))) + \max_{1 \le i \le NPath} \left( \frac{\omega_i(\vec{PS}(s,k)) \cdot p^{enc}(s,k,c(\vec{PS}(s,k))) \cdot P^{size}}{\tilde{tr}_i^{TFRC}} \right) \right),$$

subject to $s \in S^{size}, k \in K^{num}$, $$enc^{time}(s,k,c(\vec{PS}(s,k))) + \tilde{dec}^{time}(s,k) + \max_{1 \le i \le NPath} \left( \frac{(\omega_i(\vec{PS}(s,k)) \cdot p^{enc}(s,k,c(\vec{PS}(s,k))) + n_{buf_i}^{total}) \cdot P_{size}}{\tilde{tr}_i^{TFRC}} + d_i \right) \le \frac{\chi \cdot buf^{recv}}{VR},$$

wherein s denotes the size of the source symbol, k denotes the number of the source symbols, $enc^{time}(s,k,c(\vec{PS}(s,k)))$ denotes the raptor encoding time, $\tilde{dec}^{time}(s,k)$ denotes an approximated raptor decoding time in the receiving end, and x denotes constant between 0 and 1, $\tilde{tr}_i^{TFRC}$ $^{TFRC}$ denotes a bandwidth of an $i^{th}$ path, $n_{buf_i}^{total}$ denotes a number of existing packets included in an $i^{th}$ path buffer, $\omega_i(\vec{PS}(s,k))$ denotes a weight used by a scheduler, $p^{enc}(s,k,c)$ denotes the number of packets in an encoded block, $s^{size}$ denotes a set of available symbol sizes, $K^{num}$ denotes a set of available numbers indicating a number of source symbols, $p^{num}(s,k)$ denotes a number of source packets, $p^{enc}(s,k,c(\vec{PS}(s,k))) \cdot P^{size}$ denotes a size of an encoded block, $buf^{recv}$ denotes an amount of data of the buffer of the receiving end, and VR denotes a bit rate of an image.

14. The method of claim 13, wherein the raptor encoding time is determined based on a following equation:

$$enc^{time}(s,k,c) = \gamma_{coef}^{enc}(s) \cdot XOR_{byte}^{enc}(s,k,c)$$

wherein $enc^{time}(s,k,c)$ denotes the raptor encoding time, $\gamma_{coef}^{enc}$ denotes an XOR operation coefficient for encoding, and $XOR_{byte}^{enc}(s,k,c)$ denotes a time when XOR is executed on a symbol based on a previously generated matrix.

15. The method of claim 14, wherein the previously generated matrix is a Code Constraints Processor/Luby Transform (CPP/LT) matrix, and the time when XOR is executed on the symbol based on the CCP/LT matrix is defined based on a following equation:

$$XOR_{byte}^{enc}(s,k,c) = s \cdot (XOR^{CCP^{enc}}(k) + XOR^{LT^{enc}}(k,c))$$

wherein s denotes the size of the source symbol, k denotes the number of the source symbols, c denotes a code rate, $XOR_{byte}^{enc}(s,k,c)$ denotes an amount of bye on which XOR is executed for encoding, $XOR^{CCP^{enc}}$ denotes a number of times of XOR of a CCP matrix for encoding, and $XOR^{LT^{enc}}$ denotes a number of times of XOR of a LT matrix for encoding.

16. A multimedia data receiving apparatus in a mobile communication system, the apparatus comprising:

a demodulator configured to demodulate multimedia data transmitted from a transmitter;

a controller configured to determine a size of a source symbol and a number of source symbols for each block, from the demodulated multimedia data; and a decoder configured to decode the multimedia data based on the determined size of the source symbol and the determined number of source symbols, wherein the controller is configured to determine a packet distribution vector by a path cost indicator (PCI) determined based on a size of a packet and a bandwidth of a path, determine a code rate based on the packet distribution vector, calculate a penalty function based on the code rate, and determine, for each block, the size of a source symbol and the number of the source symbols which satisfy a lowest value for the calculated penalty function based on an overhead value per packet calculated by using a raptor encoding time and a multiple-path transmission delay, and a constraint for preventing underflow in a buffer of a receiving end, so as to determine the size of the source symbol and the number of the source symbols for each block.

17. The apparatus of claim 16, wherein the PCI is determined based on a following equation:

$$PCI_i^{blk} = \frac{(n_{buf_i}^{blk}+1) \cdot P^{size}}{\tilde{tr}_i^{TFRC} \cdot (1-plr_i^W)} + \frac{(n_{buf_i}^{total} - n_{buf_i}^{blk}) \cdot P^{size}}{\tilde{tr}_i^{TFRC}} + d_i$$

$$\tilde{tr}_i^{TFRC} = tr_i^{TFRC} \cdot \frac{r_i^{sqmean}}{\sqrt{r_i}},$$

wherein $PCI_i^{blk}$ denotes the PCI of an $i^{th}$ path, $P_{size}$ denotes a size of a packet, $\tilde{tr}_i^{TFRC}$ $_i^{TFRC}$ denotes a bandwidth of the $i^{th}$ path, $d_i$ denotes a delay of the $i^{th}$ path, $plr_i^W$ denotes a packet loss of the $i^{th}$ path, $n_{buf_i}^{blk}$ denotes a number of packets corresponding to a $j^{th}$ block among the packets included in an $i^{th}$ path buffer, $tr^{TFRC}$ denotes a transmission rate determined using a TCP-friendly rate control (TFRC) algorithm, r denotes a Round Trip Time (RTT), and $n_{buf_i}^{total}$ denotes a number of existing packets included in the $i^{th}$ path buffer.

18. The apparatus of claim 16, wherein the size of the source symbol and the number of source symbols, satisfying that has the lowest value for the calculated penalty function, are determined based on a following equation:

$$\frac{1}{p^{num}(s,k)} \cdot \left( enc^{time}\left(s, k, c(\vec{PS}(s,k))\right) + \max_{1 \leq i \leq Npath} \left( \frac{\omega_i(\vec{PS}(s,k)) \cdot p^{enc}(s, k, c(\vec{PS}(s,k))) \cdot P^{size}}{\tilde{tr}_i^{TFRC}} \right) \right),$$

subject to $s \in S^{size}, k \in K^{num}$, $$enc^{time}\left(s, k, c(\vec{PS}(s,k))\right) + \tilde{dec}^{time}(s,k) + \max_{1 \leq i \leq Npath} \left( \frac{(\omega_i(\vec{PS}(s,k)) \cdot p^{enc}(s, k, c(\vec{PS}(s,k))) + n_{buf_i}^{total}) \cdot P_{size}}{\tilde{tr}_i^{TFRC}} + d_i \right) \leq \frac{\chi \cdot buf^{recv}}{VR},$$

wherein s denotes the size of the source symbol, k denotes the number of the source symbols, $enc^{time}(s,k,c(\vec{PS}(s,k)))$ denotes the raptor encoding time, $\tilde{dec}^{time}(s,k)$ denotes an approximated raptor decoding time in receiving end, and x denotes constant between 0 and 1, $\tilde{tr}_i^{TFRC}$ $_i^{TFRC}$ denotes a bandwidth of an $i^{th}$ path, $n_{buf_i}^{total}$ denotes a number of existing packets included in an $i^{th}$ path buffer, $\omega_i(\vec{PS}(s,k))$ denotes a weight used by a scheduler, $P^{enc}(s,k,c)$ denotes the number of packets in an encoded block, $S^{size}$ denotes a set of available symbol sizes, $K^{num}$ denotes a set of available numbers indicating a number of source symbols, $p^{num}(s,k)$ denotes a number of source packets, $p^{enc}(s,k,c(\vec{PS}(s,k))) \cdot P^{size}$ denotes a size of an encoded block, $buf^{recv}$ denotes an amount of data of the buffer of the receiving end, and VR denotes a bit rate of an image.

19. The apparatus of claim 18, wherein the raptor encoding time is determined based on a following equation:

$$enc^{time}(s,k,c) = \gamma_{coef}^{enc}(s) \cdot XOR_{byte}^{enc}(s,k,c)$$

wherein $enc^{time}(s,k,c)$ denotes the raptor encoding time, $\gamma_{coef}^{enc}$ denotes an XOR operation coefficient for encoding, and $XOR_{byte}^{enc}(s_i^{size}, s_i^{num}, c_i)$ denotes a time when XOR is on a symbol based on a previously generated matrix.

20. The apparatus of claim 19, wherein the previously generated matrix is a Code Constraints Processor/Luby Transform (CCP/LT) matrix, and the time when XOR is executed on the symbol based on the CCP/LT matrix is defined by a the following equation:

$$XOR_{byte}^{enc}(s,k,c) = s \cdot (XOR^{CCP^{enc}}(k) + XOR^{LT^{enc}}(k,c))$$

wherein s denotes the size of the source symbol, k denotes the number of the source symbols, c denotes a code rate, $XOR_{byte}^{enc}(s,k,c)$ denotes an amount of bye on which XOR is executed for encoding, $XOR^{CCP^{enc}}$ denotes a number of times of XOR of a CCP matrix for encoding, and $XOR^{LT^{enc}}$ denotes a number of times of XOR of a LT matrix for encoding.

* * * * *